United States Patent [19]

Kudo et al.

[11] Patent Number: 5,027,368
[45] Date of Patent: Jun. 25, 1991

[54] SEMICONDUCTOR LASER DEVICE

[75] Inventors: Hiroaki Kudo, Tenri; Haruhisa Takiguchi, Nara; Chitose Sakane, Nara; Satoshi Sugahara, Nara, all of Japan

[73] Assignee: Sharp Kabushiki Kaisha, Osaka, Japan

[21] Appl. No.: 394,327

[22] Filed: Aug. 16, 1989

[30] Foreign Application Priority Data

Aug. 17, 1988 [JP] Japan .............................. 63-204231

[51] Int. Cl.$^5$ ............................................... H01S 3/08
[52] U.S. Cl. ........................................ 372/96; 372/46; 372/48
[58] Field of Search ............................... 372/96, 48, 46

[56] References Cited

U.S. PATENT DOCUMENTS 4,740,987 4/1988 McCall, Jr. et al. ................... 372/96

FOREIGN PATENT DOCUMENTS 187718 7/1986 European Pat. Off. .
0247986 12/1985 Japan ..................................... 372/96
63-285993 11/1988 Japan .

OTHER PUBLICATIONS

Streifer et al., IEEE Journal of Quantum Electronics, vol. QE-11, No. 11, (Nov. 1975), pp. 867–873.
Nakano et al., Applied Physics Letters, vol. 49, No. 18, (Nov. 3, 1986), pp. 1145–1147.
Chong et al., Electronics Letters, vol. 24, No. 7, (Mar. 31, 1988), pp. 416–418.
Temkin et al., Journal of Lightwave Technology, vol. LT-4, No. 5, (May 1986), pp. 520–529.
Kawanishi et al., Japanese Journal of Applied Physics, vol. 17, No. 9, (Sep. 1978), pp. 1599–1603.

*Primary Examiner*—Georgia Epps
*Attorney, Agent, or Firm*—Irell & Manella

[57] ABSTRACT

A semiconductor laser device with a resonator containing an active region for laser oscillating operation is disclosed which comprises a third-order diffraction grating with a periodic corrugation for producing feedback of laser light, the corrugation being of substantially rectangular shape, wherein the ratio of the width of each convex portion of the corrugation to the periodicity of the corrugation is in the range of 0.20 to 0.25, 0.40 to 0.60, or 0.70 to 0.95.

8 Claims, 3 Drawing Sheets

FIG. 6

SEMICONDUCTOR LASER DEVICE

BACKGROUND OF THE INVENTION

1. Field of the Invention

This invention relates to a semiconductor laser device having a diffraction grating for producing feedback of laser light, which attains laser oscillation in a single longitudinal mode.

2. Description of the Prior Art

Semiconductor laser devices used as a light source in optical information processing systems, optical measuring systems, or other systems employing optical fibers are required to have operating characteristics that can provide laser oscillation in a single longitudinal mode. The semiconductor laser devices that can attain laser oscillation in a single longitudinal mode, that is, can emit laser light of a single wavelength, include distributed feedback (DFB) laser devices and distributed Bragg reflection (DBR) laser devices, which have a diffraction grading with a periodic corrugation formed in an active region and in the area adjacent to the active region, respectively, and emit laser light of a given wavelength.

For example, a conventional distributed feedback laser device comprises a diffraction grating with a periodic corrugation disposed on the surface of an n-type InP substrate, and an n-type InGaAs optical waveguide layer and an InGaAs active layer, both of which are disposed thereon, wherein laser light goes back and forth in the diffraction grating, resulting in laser oscillation.

In order to obtain the oscillation of laser light in the diffraction grating with a periodicity $\Lambda$, the following relation is required to hold:

$$\Lambda = (N/2) \cdot (\lambda/n_o) \quad (I)$$

where $\lambda$ is the oscillation wavelength, $n_o$ is an equivalent refractive index, and $N$ is a natural number, which denotes the order of the diffraction grating. For example, when $\lambda = 1.3$ to $1.5$ $\mu m$, $n_o = 3.3$, and $N = 1$, $\Lambda$ is in the range of 1970 to 2350 Å. That is, the periodicity of the first-order diffraction grating is in the range of 1970 to 2350 Å.

On the other hand, for a distributed feedback semiconductor laser device comprising a GaAlAs layer, as an active layer, formed on the GaAs substrate, which can provide an oscillation wavelength of 8900 Å or less, when $\lambda \geq 8900$ Å, $n_o = 3.4$, and $N = 1$, $\Lambda$ is equal to or less than 1310 Å. That is, the periodicity of the first-order diffraction grating is 1310 Å or less. Moreover, as can be seen from Equation I, by increasing the order of the diffraction grating, the periodicity $\Lambda$ of the diffraction grating increases by a factor of that order.

To form such a diffraction grating, a holographic exposing system is employed that uses a He-Cd laser (wavelength $\lambda_o = 3250$ Å). That is, a photoresist layer is formed on the substrate, and then exposed with an interference fringe pattern of the He-Cd laser, after which the photoresist layer thus exposed is developed to form a striped photoresist mask with a given periodicity. Using this photoresist mask, a diffraction grating with a periodic corrugation is formed on the substrate by a chemical etching technique.

The coupling efficiency of the diffraction grating increases by increasing the depth of the diffraction grating. When a diffraction grating of lower order is the same in shape and depth as a diffraction grating of higher order, the diffraction grating of the lower order has a coupling efficiency greater than that of the diffraction grating of the higher order. However, it is technically impossible to form a diffraction grating of the first order, which can be used for short wavelength AlGaAs DFB laser devices, with the conventional holographic exposing system (light source: He-Cd laser, wavelength $\lambda_o 3250$ Å).

Accordingly, a second-order diffraction grating with a periodic triangular shaped corrugation formed in the $[0\bar{1}1]$ direction. However, it is very difficult to form such a second-order triangular shaped diffraction grating because its periodicity $\Lambda$ is extremely small. Moreover, because the depth of the diffraction grating is small, it is difficult to form a diffraction grating with high accuracy and to obtain a high coupling efficiency.

For these reasons, the order of the diffraction grating is taken as the third order to form the diffraction grating with high accuracy, and the periodic corrugation of rectangular shape is formed in the $[011]$ direction to obtain high coupling efficiency as compared to the periodic corrugation of triangular shape. However, even with such a rectangular shaped diffraction grating, there is a problem of how to obtain a high coupling efficiency.

SUMMARY OF THE INVENTION

The semiconductor laser device with a resonator containing an active region of this invention, which overcomes the above-discussed and numerous other disadvantages and deficiencies of the prior art, comprises a third-order diffraction grating with a periodic corrugation for producing feedback of laser light, said corrugation being of substantially rectangular shape, wherein the ratio of the width of each convex portion of said corrugation to the periodicity of said corrugation is in the range of 0.20 to 0.25, 0.40 to 0.60, or 0.70 to 0.95.

In a preferred embodiment, the diffraction grating is positioned in said active region to produce the distributed feedback of laser light.

In a preferred embodiment, the diffraction grating is positioned in the area adjacent to said active region to produce the distributed Bragg reflection of laser light.

Alternatively, another preferred semiconductor laser device of this invention comprises an active layer positioned between a first cladding layer and a second cladding layer, and an optical guiding layer positioned between said active layer and one of said cladding layers, said optical guiding layer having a third-order diffraction grating with a periodic corrugation of substantially rectangular shape, wherein the ratio of the width of each convex portion of said corrugation to the periodicity of said corrugation is in the range of 0.20 to 0.25, 0.40 to 0.60, or 0.70 to 0.95.

In a preferred embodiment, a carrier barrier layer of the same conductivity type as one of the cladding layers is positioned between said active layer and said optical guiding layer.

In a preferred embodiment, the periodic corrugation of said diffraction grating is formed in the $[0\bar{1}1]$ direction.

In a preferred embodiment, the first cladding layer is disposed on a current blocking layer and said current blocking layer is disposed on a substrate, wherein said current blocking layer contains a V-shaped channel that reaches said substrate and wherein an electric current is injected into said active layer through said V-shaped channel.

Thus, the invention described herein makes possible the objectives of (1) providing a semiconductor laser device having a third-order diffraction grating with high coupling efficiency, which can attain stable laser oscillation in a single longitudinal mode; (2) providing a semiconductor laser device having a third-order diffraction grating, in which the diffraction grating has a periodicity greater than that of conventional second-order diffraction gratings, thereby attaining its high accuracy; and (3) providing a semiconductor laser device having a third-order diffraction grating, in which the diffraction grating has a periodic corrugation of substantially rectangular shape, thereby attaining its high coupling efficiency.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention is realized on the basis of the findings by the present inventors that the coupling efficiency of a diffraction grating varies significantly depending on the ratio of the width of each convex portion of the diffraction grating to the periodicity Λ of the diffraction grating. For example, in a third-order diffraction grating with a rectangular shaped corrugation, when the ratio of the width of each convex portion to the periodicity of the diffraction grating is set at around 3:1 or around 3:2, the coupling efficiency amounts to approximately 0 cm$^{-1}$, thereby making it impossible to obtain satisfactory effect of the diffraction grating. On the other hand, when the ratio of the width of each convex portion to the periodicity of the diffraction grating is in the range of 0.20 to 0.25, 0.40 to 0.60, or 0.70 to 0.95, the coupling efficiency is extremely higher than that obtained in the diffraction grating with a conventional structure. Therefore, when the corrugation of the diffraction grating is formed into a shape which gives a ratio falling within these ranges, a semiconductor laser device with high coupling efficiency can be obtained.

EXAMPLES

Figure 1:
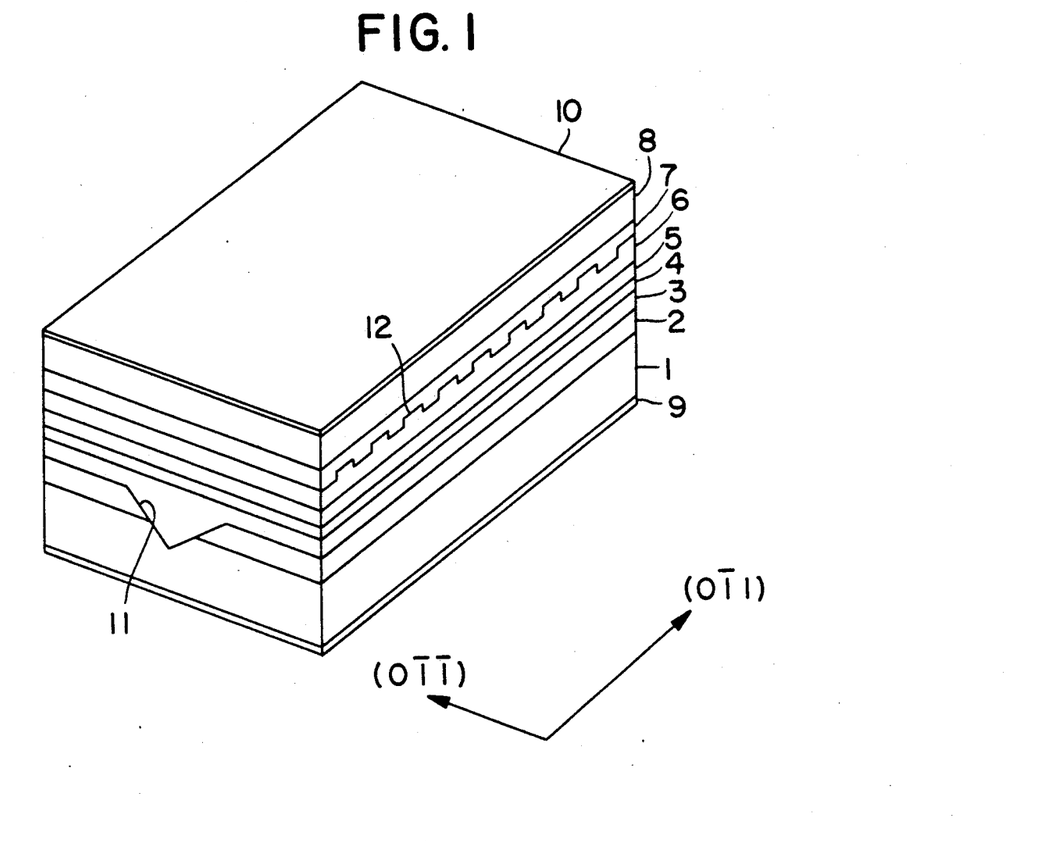
FIG. 1 is a perspective view showing a semiconductor laser device of this invention.
Figure 2:
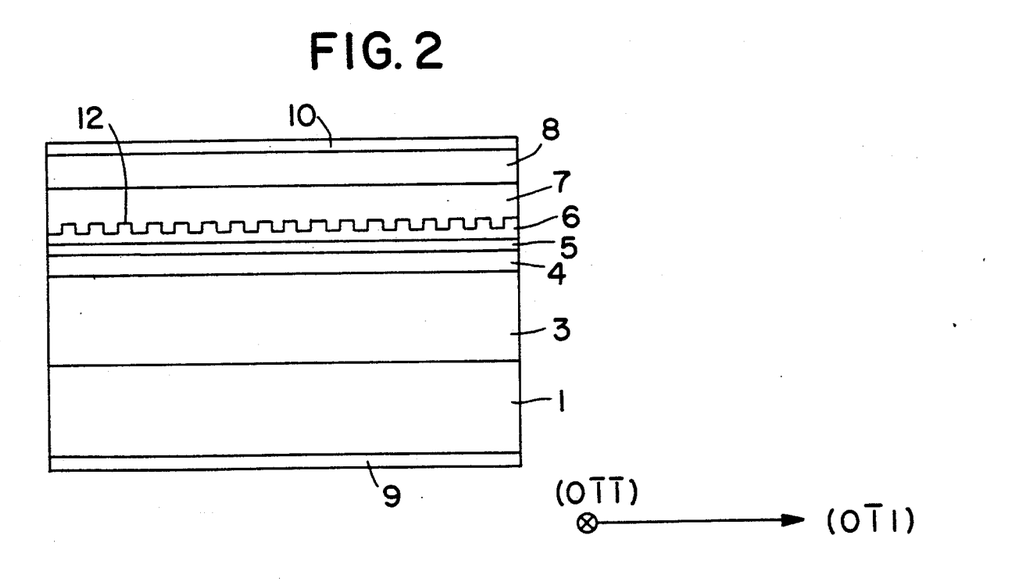
FIG. 2 is a longitudinal sectional view, taken at the center plane along the [01̄1] direction, showing the semiconductor laser device of FIG. 1.

FIG. 1 shows a distributed feedback V-channeled substrate inner stripe (DFB-VSIS) laser device of this invention. FIG. 2 is a sectional view, taken at the center plane parallel to the direction of the propagation of laser light, showing the DFB-VSIS laser device of FIG. 1. This laser device is produced as follows:

As shown in FIG. 1, on a p-type GaAs substrate 1, an n-type GaAs current blocking layer 2, a p-type Al$_{0.5}$Ga$_{0.5}$As cladding layer 3, a p-type Al$_{0.13}$Ga$_{0.87}$As active layer 4 (the thickness thereof being 0.10 μm), an n-type Al$_{0.5}$Ga$_{0.5}$As carrier barrier layer 5 (the thickness thereof being 0.05 μm), an n-type Al$_{0.25}$Ga$_{0.75}$As optical guiding layer 6 (the thickness thereof being 0.15 μm), an n-type Al$_{0.5}$Ga$_{0.5}$As or n-type Al$_{0.75}$Ga$_{0.25}$As cladding layer 7, and an n-type GaAs cap layer 8 are successively grown by an appropriate growth method and an Au/Zn electrode 9 and an Au/Ge/Ni electrode 10 are formed on the back surface of the p-type GaAs substrate 1 and the upper surface of the cap layer 8, respectively.

In the n-type current blocking layer 2, a V-shaped channel 11 having sufficient depth to reach the p-type substrate 1, is formed in the [01̄1] direction, and an electric current is injected into the p-type active layer 4 through the region of this V-shaped channel 11.

At the interface between the n-type optical guiding layer 6 and the n-type cladding layer 7, a periodic corrugation is formed to constitute a diffraction grating 12. The periodic corrugation of the diffraction grating 12 is repeated in the [01̄1] direction, and the grooves formed by the periodic corrugation extend in the [01̄1] direction. The periodicity of the corrugation is set so that the diffraction grating 12 is of the third order. The corrugation of the diffraction grating 12 is of substantially rectangular shape, as shown in FIG. 2.

Figure 3:
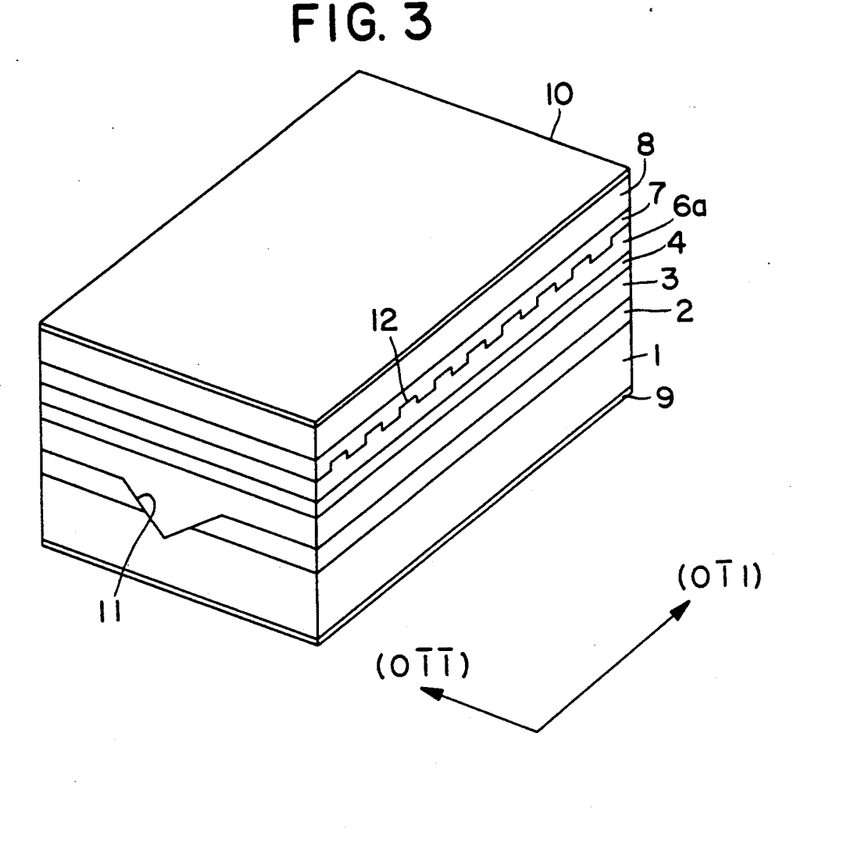
FIG. 3 is a perspective view showing another semiconductor laser device of this invention.
Figure 4:
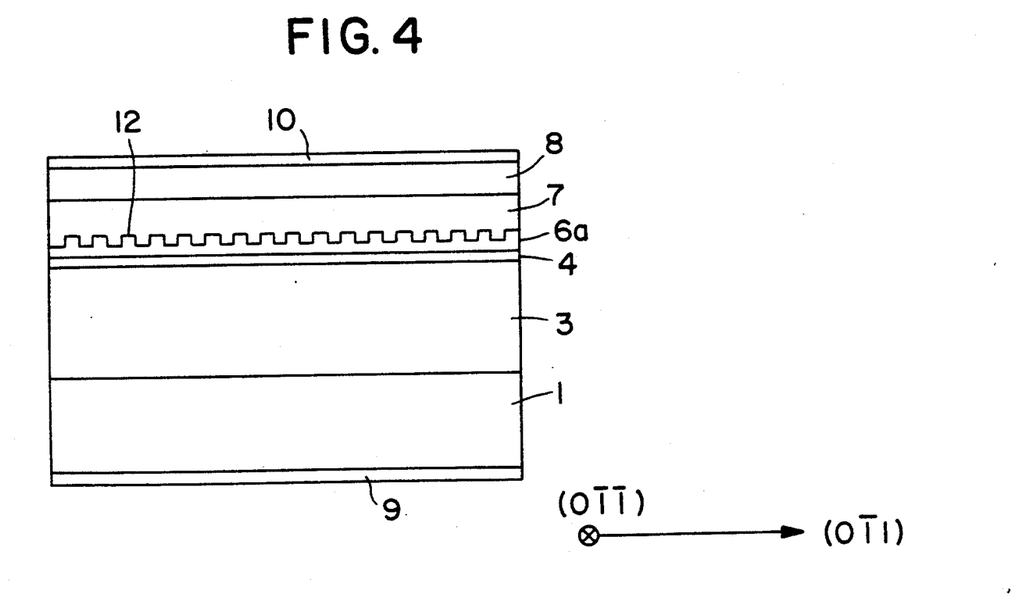
FIG. 4 is a longitudinal sectional view, taken at the center plane along the [01̄1] direction, showing the semiconductor laser device of FIG. 3.

FIG. 3 shows another DFB-VSIS laser device of this invention. FIG. 4 is a sectional view, taken at the center plane parallel to the direction of the propagation of laser light, showing the DFB-VSIS laser device of FIG. 3. This laser device is produced as follows:

As shown in FIG. 3, on a p-type GaAs substrate 1, an n-type GaAs current blocking layer 2, a p-type Al$_{0.5}$Ga$_{0.5}$As cladding layer 3, a p-type Al$_{0.13}$Ga$_{0.87}$As active layer 4 (the thickness thereof being 0.10 μm), an n-type InGaAsP optical guiding layer 6a (the thickness thereof being 0.20 μm), an n-type Al$_{0.75}$Ga$_{0.25}$As cladding layer 7 (the thickness thereof being 0.5 μm), and an n-type GaAs cap layer 8 are successively grown by an appropriate growth method. In the same manner as the first example, in the n-type current blocking layer 2, a V-shaped channel 11 having sufficient depth to reach the p-type substrate 1 is formed in the [01̄1] direction. Through the region of this V-shaped channel 11, an electric current is injected into the p-type active layer 4. Furthermore, at the interface between the n-type light guiding layer 6a and the n-type cladding layer 7, a periodic corrugation is formed to constitute a diffraction grating 12.

In the above-mentioned semiconductor laser devices, laser light goes back and forth within the diffraction grating 12 so as to resonate. The refractive index of the p-type active layer 4 is set greater than that of the p-type cladding layer 3 and n-type cladding layer 7. Accordingly, the laser light is mainly confined in the p-type active layer 4, whereas the n-type optical guiding layers 6 and 6a in which an optical waveguide is formed, serve as a buffer layer between the diffraction grating 12 and the p-type active layer 4, and also have the function of leading to laser light leaks from the p-type active layer 4 to the diffraction grating 12.

Next, the production of the diffraction grating 12 in these semiconductor laser devices will be explained below. First, a photoresist layer is formed on the surface of the n-type optical guiding layers 6 and 6a, and then exposed into a striped pattern along the [0$\bar{1}$1] direction by a holographic technique. The photoresist layer thus exposed is developed to form a photoresist mask. Using this photoresist mask, the surface region of the n-type optical guiding layers 6 and 6a is etched with an etchant (a mixed solution of bromine water, phosphoric acid, and water) to form a corrugation with a given periodicity in the [0$\bar{1}$1] direction, resulting in a diffraction grating 12 of the third order.

Figure 5:
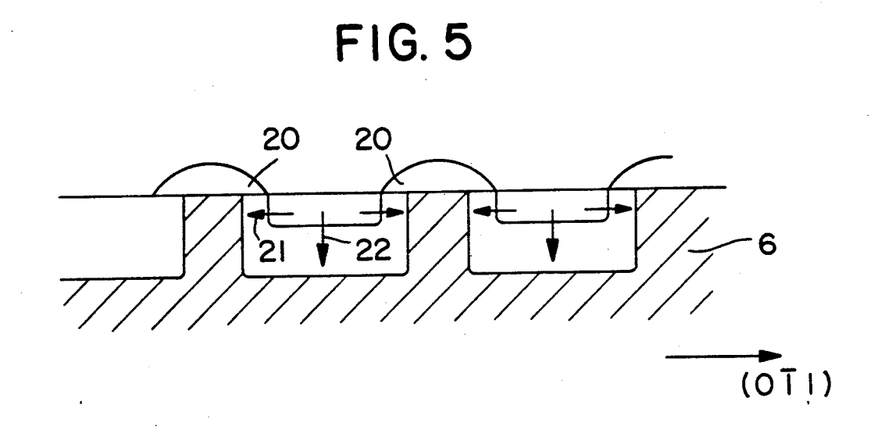
FIG. 5 is a schematic diagram showing a process of forming a diffraction grating of this invention.

As in the above-mentioned example, when the periodic pattern of the diffraction grating 12 is formed so as to be repeated in the [0$\bar{1}$1] direction, a striped photoresist mask 20 is used which is formed periodically in the [0$\bar{1}$1] direction as shown in FIG. 5. The etching proceeds both in the horizontal direction 21 and the vertical direction 22 by the side etching effect. As a result, the diffraction grating 12 has a corrugation of substantially rectangular shape. The ratio of the degree of progress of this etching in the horizontal direction and in the vertical direction depends on the crystallographic plane orientation of the n-type optical guiding layers 6 and 6a as well as the composition of the etchant used.

The dependence of the coupling efficiency on the shape of the diffraction grating thus formed will be discussed below.

Figure 6:
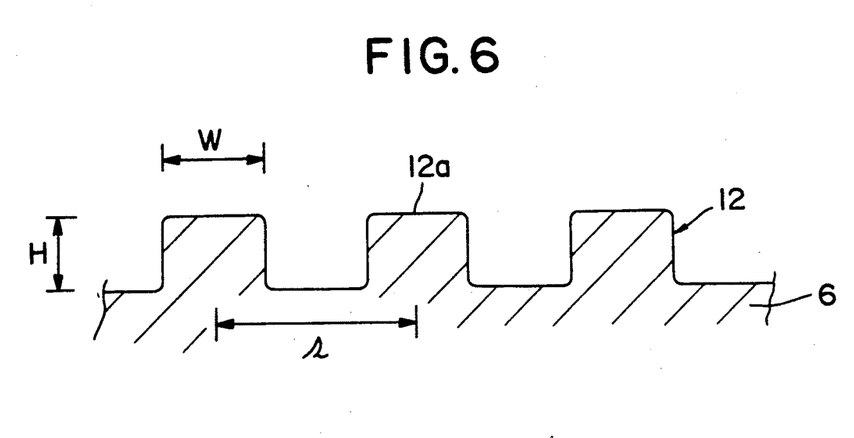
FIG. 6 is a schematic diagram showing the parameters of a diffraction grating of this invention.

For each of the third-order rectangular shaped diffraction gratings 12 of the above-mentioned semiconductor laser devices, the coupling efficiency was theoretically evaluated. The results are shown in Table 1 (for the first example) and in Table 2 (for the second example). In this evaluation, the coupling efficiency was calculated with varying duty ratios (W/Λ) when the periodicity of the diffraction grating 12 is denoted by the symbol "Λ" and the width of each convex portion 12a of the diffraction grating is denoted by the symbol "W" as shown in FIG. 6. The periodicity of the diffraction grating 12 was set to 3000 Å. The height H of the diffraction grating 12 was set to 1000 Å. In Tables 1 and 2, the mark "O" means that the diffraction gratings marked can be applied to semiconductor laser devices, whereas the mark "X" means that the diffraction gratings marked cannot be applied to semiconductor laser devices. In both examples, the coupling efficiency was approximately 0 cm$^{-1}$ at the duty ratio of either 0.33 or 0.66.

TABLE 1

| Duty ratio (W/Λ) | Coupling efficiency (cm$^{-1}$) | Applicability to semiconductor laser devices |
|---|---|---|
| 0.05 | 7.9 | X |
| 0.10 | 28.8 | X |
| 0.15 | 58.4 | X |
| 0.20 | 78.1 | O |
| 0.25 | 78.4 | O |
| 0.30 | 42.8 | X |
| 0.35 | 26.9 | X |
| 0.40 | 120.0 | O |
| 0.45 | 216.5 | O |
| 0.50 | 278.9 | O |
| 0.55 | 286.9 | O |
| 0.60 | 212.5 | O |
| 0.65 | 63.9 | X |
| 0.70 | 139.3 | O |
| 0.75 | 353.9 | O |
| 0.80 | 518.1 | O |
| 0.85 | 589.1 | O |
| 0.90 | 519.4 | O |
| 0.95 | 315.3 | O |

TABLE 2

| Duty ratio (W/Λ) | Coupling efficiency (cm$^{-1}$) | Applicability to semiconductor laser devices |
|---|---|---|
| 0.05 | 74.23 | X |
| 0.10 | 145.75 | O |
| 0.15 | 195.86 | O |
| 0.20 | 207.24 | O |
| 0.25 | 168.96 | O |
| 0.30 | 80.77 | O |
| 0.35 | 44.61 | X |
| 0.40 | 182.38 | O |
| 0.45 | 299.89 | O |
| 0.50 | 363.97 | O |
| 0.55 | 349.60 | O |
| 0.60 | 247.84 | O |
| 0.65 | 70.65 | X |
| 0.70 | 149.03 | O |
| 0.75 | 362.69 | O |
| 0.80 | 517.91 | O |
| 0.85 | 568.77 | O |
| 0.90 | 491.05 | O |
| 0.95 | 289.49 | O |

From these theoretical evaluations, it was found that when the diffraction grating 12 is formed so as to have a duty ratio (W/Λ) in the neighborhood of 0.20, 0.50, or 0.80, coupling efficiency enough for the purpose of application to semiconductor laser devices can be obtained even in the third-order rectangular shaped diffraction grating.

Actually, DFB laser devices with the respective structures of the above-mentioned two examples were produced by taking the duty ratio (W/Λ) as 0.2, the periodicity as 3500 Å, and the height H as 1500 Å. Both the DFB laser devices attained stable laser oscillation in a single longitudinal mode. The temperature range ΔT for attaining laser oscillation in a single longitudinal mode was 80° C. for the AlGaAs DFB laser device (in the first example), and 110° C. for the AlGaAs DFB laser device having an InGaAsP optical guiding layer (in the second example). Thus, extremely excellent results were obtained.

Although the above-mentioned examples only disclose two types of AlGaAs DFB laser devices, this invention is widely applicable to semiconductor laser devices made of other compound semiconductor materials, such as AlGaInP DFB laser devices capable of emitting visible light and the like. Moreover, this invention is not limited to distributed feedback (DFB) laser devices, but is also applicable to distributed Bragg reflection (DBR) laser devices.

Although the above-mentioned examples only disclose, as a method of forming the third-order rectangular shaped diffraction grating, a chemical etching technique that uses an anisotropy in the plane orientation of wafers, such a diffraction grating can also be formed by any other technique. For example, the rectangular shaped diffraction grating can be formed by a dry etching technique so as to have a duty ratio in the neighborhood of 0.20, 0.50, or 0.80. Moreover, the diffraction grating can be readily formed because the periodicity Λ thereof can be set greater when compared with conventional second-order diffraction gratings.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semi-conductor laser device with a resonator containing an active region for laser oscillating operation, comprising an active layer in said active region and a third-order diffraction grating formed in the vicinity of said active layer, said diffraction grating having a periodic corrugation for producing feedback of laser light, said corrugation being of substantially rectangular shape, a device wherein the ratio of the width of each convex portion of said corrugation to the periodicity of said corrugation is in the range of 0.20 to 0.25, 0.40 to 0.60, or 0.70 to 0.95.

2. A semiconductor laser device according to claim 1, wherein said diffraction grating is positioned in said active region to produce the distributed feedback of laser light.

3. A semiconductor laser device according to claim 1, wherein said diffraction grating is positioned in the area adjacent to said active region to produce the distributed Bragg reflection of laser light.

4. In a semiconductor laser device comprising an active layer positioned between a first cladding layer and a second cladding layer, and an optical guiding layer formed on said active layer, said optical guiding layer having a third-order diffraction grating with a periodic corrugation of substantially rectangular shape on a surface opposite said active layer, a device wherein the ratio of the width of each convex portion of said corrugation to the periodicity of said corrugation is in the range of 0.20 to 0.25, 0.40 to 0.60, or 0.7 to 0.95.

5. A semiconductor laser device according to claim 4, wherein a carrier barrier layer of the same conductivity type as one of the cladding layers is positioned between said active layer and said optical guiding layer.

6. A semiconductor laser device according to claim 4, wherein the periodic corrugation of said diffraction grating is formed in the [0$\bar{1}$1] direction.

7. A semiconductor laser device according to claim 4, wherein said first cladding layer is disposed on a current blocking layer and said current blocking layer is disposed on a substrate, wherein said current blocking layer contains a V-shaped channel that reaches said substrate and wherein an electric current is injected in said active layer through said V-shaped channel.

8. A semiconductor laser device according to claim 7, wherein a carrier barrier layer of the same conductivity type as one of the cladding layers is positioned between said active layer and said optical guiding layer.

* * * * *

UNITED STATES PATENT AND TRADEMARK OFFICE
CERTIFICATE OF CORRECTION

PATENT NO. : 5,027,368

DATED : June 25, 1991

INVENTOR(S) : Hiroaki Kudo et al

It is certified that error appears in the above-identified patent and that said Letters Patent is hereby corrected as shown below:

The title page, should be deleted to be replaced with the attached title page.

The drawing sheets, consisting of FIGS. 1-6, should be deleted and replaced with drawing sheets 3-6, (FIGS. 1-6), as shown on the attached pages

United States Patent [19]
Kudo et al.

[11] Patent Number: 5,027,368
[45] Date of Patent: Jun. 25, 1991

[54] SEMICONDUCTOR LASER DEVICE

[75] Inventors: Hiroaki Kudo, Tenri; Haruhisa Takiguchi, Nara; Chitose Sakane, Nara; Satoshi Sugahara, Nara, all of Japan

[73] Assignee: Sharp Kabushiki Kaisha, Osaka, Japan

[21] Appl. No.: 394,327

[22] Filed: Aug. 16, 1989

[30] Foreign Application Priority Data

Aug. 17, 1988 [JP] Japan .................. 63-204231

[51] Int. Cl.$^5$ ............................... H01S 3/08
[52] U.S. Cl. ........................ 372/96; 372/46; 372/48
[58] Field of Search ............... 372/96, 48, 46

[56] References Cited

U.S. PATENT DOCUMENTS 4,740,987  4/1988  McCall, Jr. et al. ............. 372/96

FOREIGN PATENT DOCUMENTS 187718    7/1986   European Pat. Off.
0247986   12/1985  Japan ................................ 372/96
63-285993 11/1988  Japan.

OTHER PUBLICATIONS

Streifer et al., IEEE Journal of Quantum Electronics, vol. QE-11, No. 11, (Nov. 1975), pp. 867-873.
Nakano et al., Applied Physics Letters, vol. 49, No. 18, (Nov. 3, 1986), pp. 1145-1147.
Chong et al., Electronics Letters, vol. 24, No. 7, (Mar. 31, 1988), pp. 416-418.
Temkin et al., Journal of Lightwave Technology, vol. LT-4, No. 5, (May 1986), pp. 520-529.
Kawanishi et al., Japanese Journal of Applied Physics, vol. 17, No. 9, (Sep. 1978), pp. 1599-1603.

Primary Examiner—Georgia Epps
Attorney, Agent, or Firm—Irell & Manella

[57] ABSTRACT

A semiconductor laser device with a resonator containing an active region for laser oscillating operation is disclosed which comprises a third-order diffraction grating with a periodic corrugation for producing feedback of laser light, the corrugation being of substantially rectangular shape, wherein the ratio of the width of each convex portion of the corrugation to the periodicity of the corrugation is in the range of 0.20 to 0.25, 0.40 to 0.60, or 0.70 to 0.95.

8 Claims, 3 Drawing Sheets

UNITED STATES PATENT AND TRADEMARK OFFICE
CERTIFICATE OF CORRECTION

PATENT NO. : 5,027,368

DATED : June 25, 1991

INVENTOR(S) : Hiroaki Kudo et al.

It is certified that error appears in the above-identified patent and that said Letters Patent is hereby corrected as shown below:

FIG. 1

UNITED STATES PATENT AND TRADEMARK OFFICE
CERTIFICATE OF CORRECTION

PATENT NO. : 5,027,368
DATED : June 25, 1991
INVENTOR(S) : Hiroaki Kudo et al.

It is certified that error appears in the above-identified patent and that said Letters Patent is hereby corrected as shown below:

FIG. 2

UNITED STATES PATENT AND TRADEMARK OFFICE
CERTIFICATE OF CORRECTION

PATENT NO. : 5,027,368

DATED : June 25, 1991

INVENTOR(S) : Hiroaki Kudo et al.

It is certified that error appears in the above-identified patent and that said Letters Patent is hereby corrected as shown below:

UNITED STATES PATENT AND TRADEMARK OFFICE
CERTIFICATE OF CORRECTION

PATENT NO. : 5,027,368
DATED : June 25, 1991
INVENTOR(S) : Hiroaki Kudo et al.

It is certified that error appears in the above-identified patent and that said Letters Patent is hereby corrected as shown below:

UNITED STATES PATENT AND TRADEMARK OFFICE
CERTIFICATE OF CORRECTION

PATENT NO. : 5,027,368
DATED : June 25, 1991
INVENTOR(S) : Hiroaki Kudo et al.

It is certified that error appears in the above-identified patent and that said Letters Patent is hereby corrected as shown below:

FIG. 5

FIG. 6

UNITED STATES PATENT AND TRADEMARK OFFICE
CERTIFICATE OF CORRECTION

PATENT NO.   : 5,027,368
DATED        : June 25, 1991
INVENTOR(S)  : Hiroaki Kudo et al.

It is certified that error appears in the above-identified patent and that said Letters Patent is hereby corrected as shown below:

In Column 5, Table 1, line 51, please change "(W/ )" to --(W/Λ)--.

In Column 6, Table 2, line 3, please change "(W/ )" to --(W/Λ)--.

Please substitute Figures 1-6 with corrected Figures 1-6 (below):

Signed and Sealed this

Thirteenth Day of April, 1993

Attest:

STEPHEN G. KUNIN

*Attesting Officer*     Acting Commissioner of Patents and Trademarks